US008150044B2

(12) United States Patent
Goldstein et al.

(10) Patent No.: US 8,150,044 B2
(45) Date of Patent: Apr. 3, 2012

(54) METHOD AND DEVICE CONFIGURED FOR SOUND SIGNATURE DETECTION

(75) Inventors: Steven W. Goldstein, Delray Beach, FL (US); Mark A. Clements, Lilburn, GA (US); Marc A. Boillot, Plantation, FL (US)

(73) Assignee: Personics Holdings Inc., Boca Raton, FL (US)

( * ) Notice: Subject to any disclaimer, the term of this patent is extended or adjusted under 35 U.S.C. 154(b) by 1089 days.

(21) Appl. No.: 11/966,457

(22) Filed: Dec. 28, 2007

(65) Prior Publication Data

US 2008/0240458 A1 Oct. 2, 2008

Related U.S. Application Data

(60) Provisional application No. 60/883,013, filed on Dec. 31, 2006.

(51) Int. Cl.
*H03G 3/20* (2006.01)
*H04R 29/00* (2006.01)
*H04R 25/00* (2006.01)

(52) U.S. Cl. ............... 381/57; 381/56; 381/60; 381/317

(58) Field of Classification Search .................... 381/56, 381/57, 60, 317
See application file for complete search history.

(56) References Cited

U.S. PATENT DOCUMENTS

| | | | | |
|---|---|---|---|---|
| 4,837,832 | A | 6/1989 | Fanshel | |
| 5,251,263 | A * | 10/1993 | Andrea et al. | 381/71.6 |
| 5,867,581 | A | 2/1999 | Obara | |
| 6,023,517 | A | 2/2000 | Ishige | |
| 6,415,034 | B1 | 7/2002 | Hietanen | |
| 6,728,385 | B2 | 4/2004 | Kvaloy et al. | |
| 8,059,847 | B2 * | 11/2011 | Nordahn | 381/328 |
| 2004/0037428 | A1 * | 2/2004 | Keller | 381/60 |
| 2004/0234089 | A1 * | 11/2004 | Rembrand et al. | 381/312 |
| 2005/0105750 | A1 | 5/2005 | Frohlich et al. | |
| 2005/0111683 | A1 * | 5/2005 | Chabries et al. | 381/317 |
| 2005/0254665 | A1 * | 11/2005 | Vaudrey et al. | 381/72 |
| 2006/0262938 | A1 | 11/2006 | Gauger et al. | |
| 2007/0160243 | A1 * | 7/2007 | Dijkstra et al. | 381/317 |
| 2007/0223717 | A1 * | 9/2007 | Boersma | 381/74 |
| 2008/0037801 | A1 * | 2/2008 | Alves et al. | 381/71.6 |
| 2008/0137873 | A1 * | 6/2008 | Goldstein | 381/57 |

OTHER PUBLICATIONS

Office Action for U.S. Appl. No. 12/165,022, filed Jun. 30, 2008, mailed Dec. 22, 2011.

* cited by examiner

*Primary Examiner* — Victor A Mandala
(74) *Attorney, Agent, or Firm* — RatnerPrestia

(57) ABSTRACT

Methods for personalized listening which can be used with an earpiece are provided. A method includes capturing ambient sound from an Ambient Sound Microphone (ASM) of an earpiece partially or fully occluded in an ear canal, monitoring the ambient sound for a target sound, and adjusting by way of an Ear Canal Receiver (ECR) in the earpiece a delivery of audio to an ear canal based on a detected target sound. A volume of audio content can be adjusted upon the detection of a target sound, and an audible notification can be presented to provide a warning.

21 Claims, 5 Drawing Sheets

800

METHOD AND DEVICE CONFIGURED FOR SOUND SIGNATURE DETECTION

CROSS REFERENCE TO RELATED APPLICATIONS

This Application is a Non-Provisional and claims the priority benefit of Provisional Application No. 60/883,013 filed on Dec. 31, 2006, the entire disclosure of which is incorporated herein by reference.

FIELD

The present invention relates to a device that monitors target (e.g. warning) sounds, and more particularly, though not exclusively, to an earpiece and method of operating an earpiece that detects target sounds.

BACKGROUND

Excess noise exposure can generate auditory fatigue, possibly compromising a person's listening abilities. On a daily basis, people are exposed to various environmental sounds and noises within their environment, such as the sounds from traffic, construction, and industry. Some of the sounds in the environment may correspond to warnings, such as those associated with an alarm or siren. A person that can hear the warning sounds can generally react in time to avoid danger. In contrast, a person that cannot adequately hear the warning sounds, or whose hearing faculties have been compromised due to auditory fatigue, may be susceptible to danger.

Environmental noise can mask warning sounds and impair a person's judgment. Moreover, when people wear headphones to listen to music, or engage in a call using a telephone, they can effectively impair their auditory judgment and their ability to discriminate between sounds. With such devices, the person is immersed in the audio experience and generally less likely to hear target sounds within their environment. In some cases, the user may even turn up the volume to hear their personal audio over environmental noises. This can put the user in a compromising situation since they may not be aware of target sounds in their environment. It also puts them at high sound exposure risk, which can potentially cause long term hearing damage.

A need therefore exists for enhancing the user's ability to hear target sounds in their environment without compromising his hearing.

SUMMARY

At least one exemplary embodiment is directed to a method and device for sound signature detection.

In at least one exemplary embodiment, an earpiece, can include an Ambient Sound Microphone (ASM) configured to capture ambient sound, at least one Ear Canal Receiver (ECR) configured to deliver audio to an ear canal, and a processor operatively coupled to the ASM and the at least one ECR to monitor target sounds in the ambient sound. Target (e.g., warning) sounds can be amplified, attenuated, or reproduced and reported to the user by way of the ECR. As an example, the target (e.g., warning) sound can be an alarm, a horn, a voice, or a noise. The processor can detect sound signatures in the ambient sound to identify the target (e.g., warning) sounds and adjust the audio delivered to the ear canal based on detected sound signatures.

In a second exemplary embodiment, a method for personalized listening suitable for use with an earpiece is provided.

The method can include capturing ambient sound from an Ambient Sound Microphone (ASM) of an earpiece that is partially or fully occluded in an ear canal, monitoring the ambient sound for a target sound, and adjusting by way of an Ear Canal Receiver (ECR) in the earpiece a delivery of audio to an ear canal based on a detected target sound. The method can include passing, amplifying, attenuating, or reproducing the target sound for delivery to the ear canal.

In a third exemplary embodiment a method for personalized listening suitable for use with an earpiece can include the steps of capturing ambient sound from an Ambient Sound Microphone (ASM) of an earpiece that is partially or fully occluded in an ear canal, detecting a sound signature within the ambient sound that is associated with a target sound, and mixing the target sound with audio content delivered to the earpiece in accordance with a priority of the target sound. A direction and speed of a sound source generating the target sound can be determined, and presented as a notification to a user of the earpiece. The method can include detecting a spoken utterance in the ambient sound that corresponds to a verbal warning or help request.

In a fourth exemplary embodiment a method for sound signature detection can include capturing ambient sound from an Ambient Sound Microphone (ASM) of an earpiece, and receiving a directive to learn a sound signature within the ambient sound. The method can include receiving a voice command or detecting a user interaction with the earpiece to initiate the step of capturing and learning. A sound signature can be generated for a target sound in the environment and saved to a memory locally on the earpiece or remotely on a server.

In a fifth exemplary embodiment a method for personalized listening can include capturing ambient sound from an Ambient Sound Microphone (ASM) of an earpiece that is partially or fully occluded in an ear canal, detecting a sound signature within the ambient sound that is associated with a target sound, and mixing the target sound with audio content delivered to the earpiece in accordance with a priority of the target sound and a personalized hearing level (PHL). The method can include retrieving from a database learned models, comparing the sound signature to the learned models, and identifying the target sound from the learned models in view of the comparison. Auditory queues in the target sound can be enhanced relative to the audio content based on a spectrum of the ambient sound captured at the ASM. A perceived direction of a sound source generating the target sounds can be spatialized using Head Related Transfer Functions (HRTFs).

DETAILED DESCRIPTION

Figure 1:
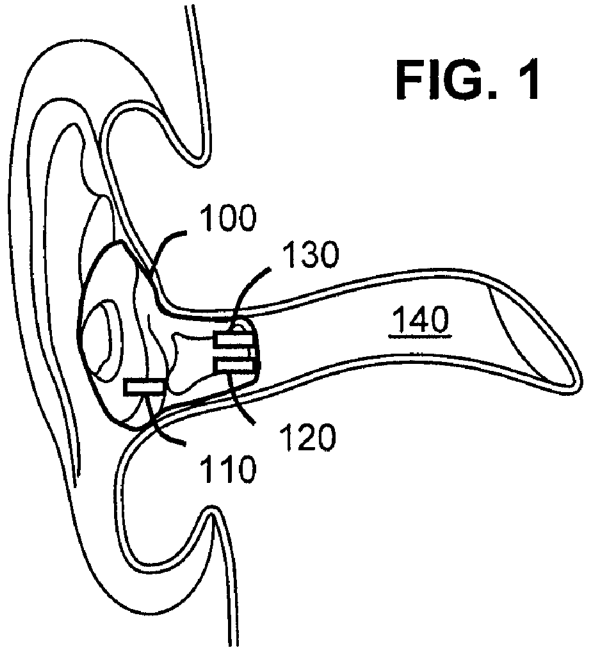
FIG. 1 is a pictorial diagram of an earpiece in accordance with an exemplary embodiment.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication and use of transducers. Additionally in at least one exemplary embodiment the sampling rate of the transducers can be varied to pick up pulses of sound, for example less than 50 milliseconds.

In all of the examples illustrated and discussed herein, any specific values, for example the sound pressure level change, should be interpreted to be illustrative only and non-limiting. Thus, other examples of the exemplary embodiments could have different values.

Note that similar reference numerals and letters refer to similar items in the following figures, and thus once an item is defined in one figure, it may not be discussed for following figures.

Note that herein when referring to correcting or preventing an error or damage (e.g., hearing damage), a reduction of the damage or error and/or a correction of the damage or error are intended.

At least one exemplary embodiment of the invention is directed to an earpiece for ambient sound monitoring and target detection. Reference is made to FIG. 1 in which an earpiece device, generally indicated as earpiece 100, is constructed in accordance with at least one exemplary embodiment of the invention. Earpiece 100 includes an Ambient Sound Microphone (ASM) 110 to capture ambient sound, an Ear Canal Receiver (ECR) 120 to deliver audio to an ear canal 140, and an ear canal microphone (ECM) 130 to assess a sound exposure level within the ear canal. The earpiece 100 can partially or fully occlude the ear canal 140 to provide various degrees of acoustic isolation.

The earpiece 100 can actively monitor a sound pressure level both inside and outside an ear canal and enhance spatial and timbral sound quality to ensure safe reproduction levels. The earpiece 100 in various exemplary embodiments can provide listening tests, filter sounds in the environment, monitor target sounds in the environment, present notifications based on identified target sounds, adjust audio content levels with respect to ambient sound levels, and filter sound in accordance with a Personalized Hearing Level (PHL). The earpiece 100 is suitable for use with users having healthy or abnormal auditory functioning. The earpiece 100 can be an in the ear earpiece, behind the ear earpiece, receiver in the ear, open-fit device, or any other suitable earpiece type. Accordingly, the earpiece 100 can be partially or fully occluded in the ear canal.

As part of its operation, the earpiece 100 can generate an Ear Canal Transfer Function (ECTF) to model the ear canal 140 using ECR 120 and ECM 130. The ECTF can be used to establish a personalized hearing level profile. The earpiece 100 can also determine a sealing profile with the user's ear to compensate for any sound leakage. In one configuration, the earpiece 100 can provide personalized full-band width general audio reproduction within the user's ear canal via timbral equalization based on the ECTF to account for a user's hearing sensitivity. The earpiece 100 also provides Sound Pressure Level dosimetry to estimate sound exposure of the ear and associated recovery times from excessive sound exposure. This permits the earpiece 100 to safely administer and monitor sound exposure to the ear.

Figure 2:
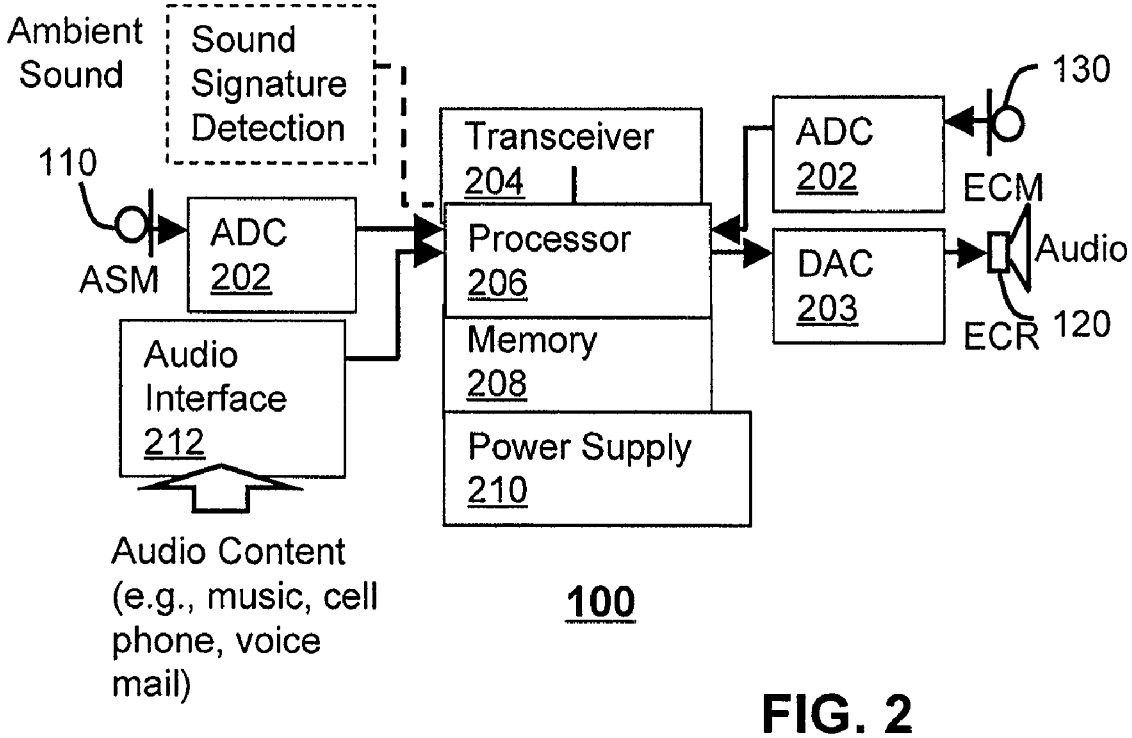
FIG. 2 is a block diagram of the earpiece in accordance with an exemplary embodiment.

Referring to FIG. 2, a block diagram of the earpiece 100 in accordance with an exemplary embodiment is shown. As illustrated, the earpiece 100 can include a processor 206 operatively coupled to the ASM 110, ECR 120, and ECM 130 via one or more Analog to Digital Converters (ADC) 202 and Digital to Analog Converters (DAC) 203. The processor 206 can monitor the ambient sound captured by the ASM 110 for target sounds in the environment, such as an alarm (e.g., bell, emergency vehicle, security system, etc.), siren (e.g, police car, ambulance, etc.), voice (e.g., "help", "stop", "police", etc.), or specific noise type (e.g., breaking glass, gunshot, etc.). The memory 208 can store sound signatures for previously learned target sounds from which the processor 206 refers to for detecting target sounds. The sound signatures can be resident in the memory 208 or downloaded to the earpiece 100 via the transceiver 204 during operation as needed. Upon detecting a target sound, the processor 206 can report the target to the user via audio delivered from the ECR 120 to the ear canal.

The earpiece 100 can also include an audio interface 212 operatively coupled to the processor 206 to receive audio content, for example from a media player, and deliver the audio content to the processor 206. The processor 206 responsive to detecting target sounds can adjust the audio content and the target sounds delivered to the ear canal. The processor 206 can actively monitor the sound exposure level inside the ear canal and adjust the audio to within a safe and subjectively optimized listening level range. The processor 206 can utilize computing technologies such as a microprocessor, Application Specific Integrated Chip (ASIC), and/or digital signal processor (DSP) with associated storage memory 208 such as Flash, ROM, RAM, SRAM, DRAM or other like technologies for controlling operations of the earpiece device 100.

The earpiece 100 can further include a transceiver 204 that can support singly or in combination any number of wireless access technologies including without limitation Bluetooth™, Wireless Fidelity (WiFi), Worldwide Interoperability for Microwave Access (WiMAX), and/or other short or long range communication protocols. The transceiver 204 can also provide support for dynamic downloading over-the-air to the earpiece 100. It should be noted also that next generation access technologies can also be applied to the present disclosure.

The power supply 210 can utilize common power management technologies such as replaceable batteries, supply regulation technologies, and charging system technologies for supplying energy to the components of the earpiece 100 and to facilitate portable applications. A motor (not shown) can be a single supply motor driver coupled to the power supply 210 to improve sensory input via haptic vibration. As an example, the processor 206 can direct the motor to vibrate responsive to an action, such as a detection of a target sound or an incoming voice call.

The earpiece 100 can further represent a single operational device or a family of devices configured in a master-slave arrangement, for example, a mobile device and an earpiece. In the latter exemplary embodiment, the components of the earpiece 100 can be reused in different form factors for the master and slave devices.

Figure 3:
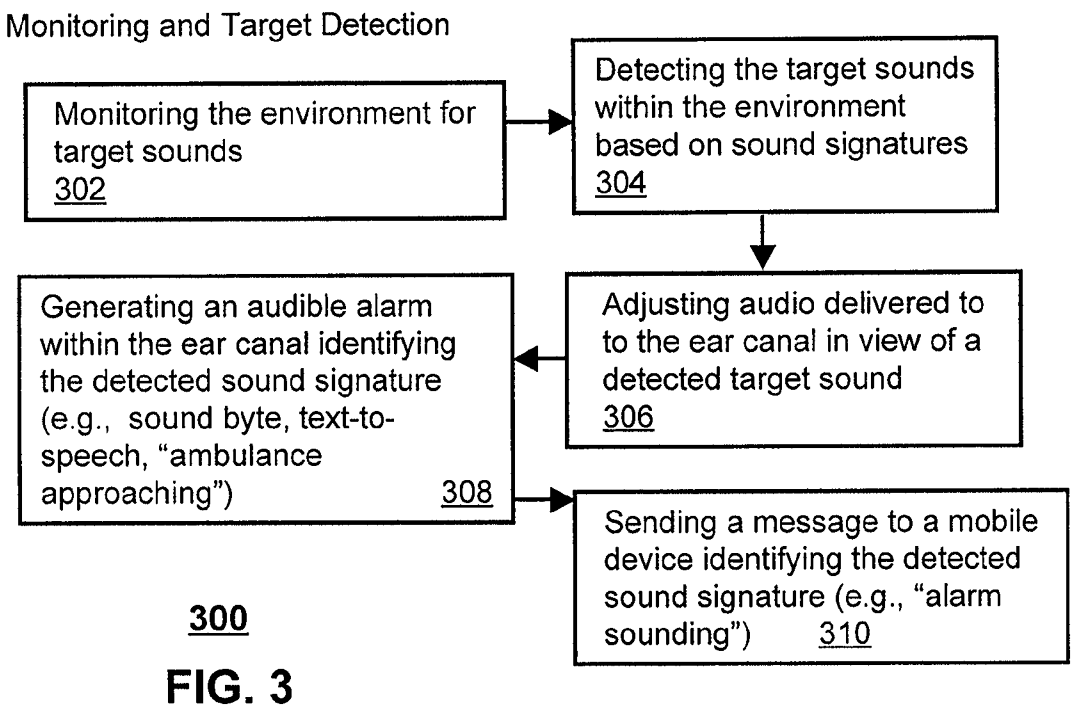
FIG. 3 is a flowchart of a method for ambient sound monitoring and target detection in accordance with an exemplary embodiment.

FIG. 3 is a flowchart of a method 300 for earpiece monitoring and target detection in accordance with an exemplary embodiment. The method 300 can be practiced with more or less than the number of steps shown and is not limited to the order shown. To describe the method 300, reference will be made to components of FIG. 2, although it is understood that the method 300 can be implemented in any other manner using other suitable components. The method 300 can be implemented in a single earpiece, a pair of earpieces, headphones, or other suitable headset audio delivery device.

The method 300 can start in a state wherein the earpiece 100 has been inserted and powered on. As shown in step 302, the processor 206 can monitor the environment for target sounds, such as an alarm, a horn, a voice, or a noise. Each of the target sounds can have certain identifiable features that characterize the sound. The features can be collectively referred to as a sound signature which can be used for recognizing the target sound. As an example, the sound signature may include statistical properties or parametric properties of the target sound. For example, a sound signature can describe prominent frequencies with associated amplitude and phase information. As another example, the sound signature can contain principal components identifying the most likely recognizable features of a target sound.

The processor 206 at step 304 can then detect the target sounds within the environment based on the sound signatures. As will be shown ahead, feature extraction techniques are applied to the ambient sound captured at the ASM 110 to generate the sound signatures. Pattern recognition approaches are applied based on known sound signatures to detect the target sounds from their corresponding sound signatures. More specifically, sound signatures can then be compared to learned models to identify a corresponding target sound. Notably, the processor 206 can detect sound signatures from the ambient sound regardless of the state of the earpiece 100. For example, the earpiece 100 may be in a listening state wherein ambient sound is transparently passed to the ECR 120, in a media state wherein audio content is delivered from the audio interface 212 to the ECR 120, or in an active listening state wherein sounds in the environment are selectively enhanced or suppressed.

At step 306, the processor 206 can adjust sound delivered to the ear canal in view of a detected target sound. For instance, if the earpiece is in a listening state, the processor 206 can amplify detected target sounds in accordance with a Personalized Hearing Level (PHL). The PHL establishes comfortable and uncomfortable levels of hearing, and can be referenced by the processor 206 to set the volume level of the target sound (or ambient sound) so as not to exceed the user's preferred listening levels. As another example, if the earpiece is in a media state, the processor 206 can attenuate the audio content delivered to the ear canal, and amplify the target sounds in the ear canal. The PHL can also be used to properly mix the volumes of the different sounds. As yet another example, if the earpiece 100 is in an active state, the processor 206 can selectively adjust the volume of the target sounds relative to background noises in the environment.

The processor 206 can also compensate for an ear seal leakage due to a fitting of the earpiece 100 with the ear canal. An ear seal profile can be generated by evaluating amplitude and phase difference between the ASM 110 and the ECM 130 for known signals produced by the ECR 120. That is, the processor 206 can monitor and report transmission levels of frequencies through the ear canal 140. The processor 206 can take into account the ear seal leakage when performing audio enhancement, or other spectral enhancement techniques, to maintain minimal audibility of the ambient noise while audio content is playing.

Upon detecting a target sound in the ambient sound of the user's environment, the processor 206 at step 308 can generate an audible alarm within the ear canal that identifies the detected sound signature. The audible alarm can be a reproduction of the target sound, an amplification of the target sound (or the entire ambient sound), a text-to-speech message (e.g. synthetic voice) identifying the target sound, a haptic vibration via a motor in the earpiece 100, or an audio clip. For example, the earpiece 100 can play a sound bite (i.e., audio clip) corresponding to the detected target sound such as an ambulance, fire engine, or other environmental sound. As another example, the processor 206 can synthesize a voice to describe the detected target sound (e.g., "ambulance approaching"). At step 310, a message may be sent to a mobile device identifying the detected sound signature (e.g., "alarm sounding").

Figure 4:
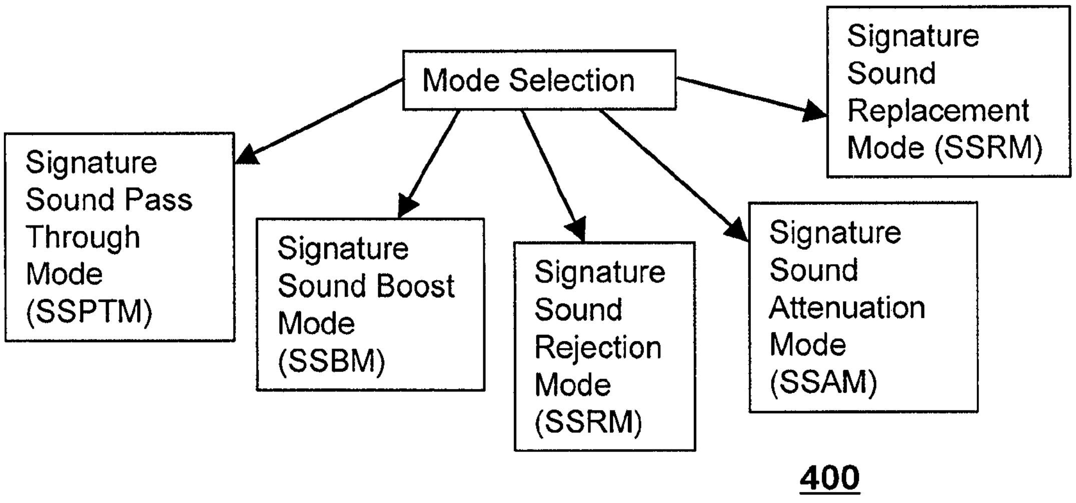
FIG. 4 illustrates earpiece modes in accordance with an exemplary embodiment.

FIG. 4 illustrates earpiece modes 400 in accordance with an exemplary embodiment. The earpiece mode can be manually selected by the user, for example, by pressing a button, or automatically selected, for example, when the earpiece 100 detects it is in an active listening state or in a media state. As shown in FIG. 4, the earpiece mode can correspond to Signature Sound Pass Through Mode (SSPTM), Signature Sound Boost Mode (SSBM), Signature Sound Rejection Mode (SSRM), Signature Sound Attenuation Mode (SSAM), and Signature Sound Replacement Mode (SSRM).

In SSPTM mode, ambient sound captured at the ASM 110 is passed transparently to the ECR 120 for reproduction within the ear canal. In this mode, the sound produced in the ear canal sufficiently matches the ambient sound outside the ear canal, thereby providing a "transparency" effect. That is, the earpiece 100 recreates the sound captured at the ASM 110 to overcome occlusion effects of the earpiece 100 when inserted within the ear. The processor 206 by way of sound measured at the ECM 130 adjusts the properties of sound delivered to the ear canal so the sound within the occluded ear canal is the same as the ambient sound outside the ear, as though the earpiece 100 were absent in the ear canal. In one configuration, the processor 206 can predict an approximation of an equalizing filter to provide the transparency by comparing an ASM 110 signal and an ECM 130 signal transfer function.

In SSBM, target sounds and/or ambient sounds are amplified upon the processor 206 detecting a target sound. The target sound can be amplified relative to the normal level received, or amplified above an audio content level if audio content is being delivered to the ear canal. As noted previously, the target sound can also be amplified in accordance with a user's PHL to be within safe hearing levels, and within subjectively determined listening levels.

In SSRM, target sounds detected in the environment can be replaced with audible warning messages. For example, the processor 206 upon detecting a target sound can generate synthetic speech identifying the target sound (e.g., "ambulance detected"). In such regard, the earpiece 100 audibly reports the target sound identified thereby relieving the user from having to interpret the target sound. The synthetic speech can be mixed with the ambient sound (e.g., amplified, attenuated, cropped, etc.), or played alone with the ambient sound muted.

In SSAM, sounds other than target sounds can be attenuated. For instance, annoying sounds or noises not associated with target sounds can be suppressed. For instance, by way of a learning session, the user can establish what sounds are considered target sounds (e.g., "ambulance") and which sounds are non-target sounds (e.g. "jackhammer"). The processor 206 upon detecting non-target sounds can thus attenuate these sounds within the occluded or partially occluded ear canal.

Figure 5:
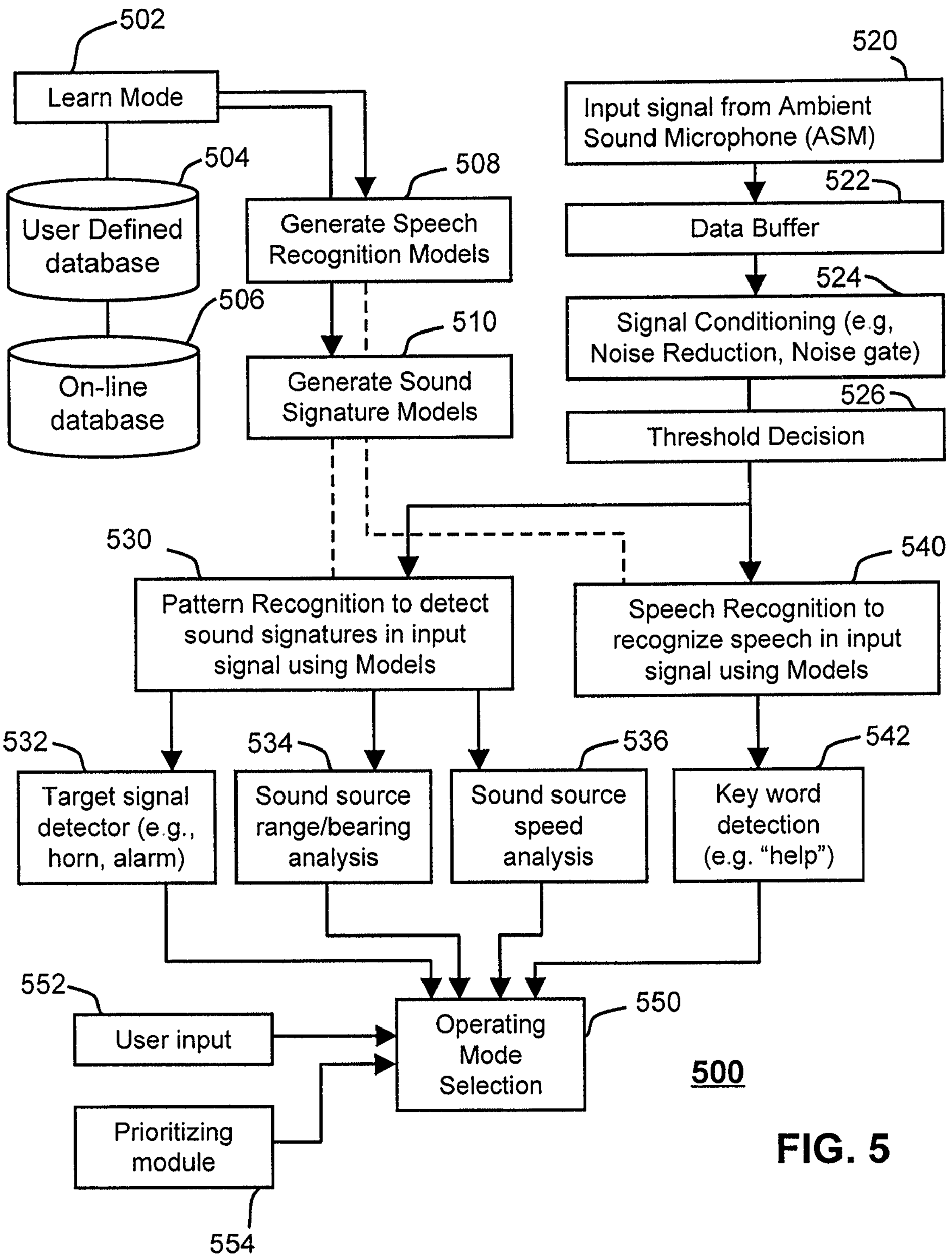
FIG. 5 illustrates a flowchart of a method for sound signature detection in accordance with an exemplary embodiment.

FIG. 5 is a flowchart of a method 500 for a method for sound signature detection in accordance with an exemplary embodiment. The method 500 can be practiced with more or less than the number of steps shown and is not limited to the order shown. To describe the method 500, reference will be made to components of FIG. 2, although it is understood that the method 500 can be implemented in any other manner using other suitable components. The method 500 can be implemented in a single earpiece, a pair of earpieces, headphones, or other suitable headset audio delivery device.

The method can start at step 502, in which the earpiece 100 can enter a learn mode. Notably, the earpiece upon completion of a learning mode or previous learning configuration can start instead at step 520. In the learning mode of step 502, the earpiece 100 can actively generate and learn sound signatures from ambient sounds within the environment. In learning mode, the earpiece 100 can also receive previously trained learning models to use for detecting target sounds in the environment. In an active learning mode, the user can press a button or otherwise (e.g. voice recognition) initiate a recording of ambient sounds in the environment. For example, the user can upon hearing a new target sound in the environment ("car horn"), activate the earpiece 100 to learn the new target sound. Upon generating a sound signature for the new target sound, it can be stored in the user defined database 504. In another arrangement, the earpiece 100 upon detecting a unique sound, characteristic to a target sound, can ask the user if they desire to have the sound signature for the unique sound learned. In such regard, the earpiece 100 actively senses sounds and queries the user about their environment to learn the sounds. Moreover, the earpiece can organize learned sounds based on environmental context, for example, in outdoor (e.g. traffic, car, etc.) or indoor (e.g., restaurant, airport) environments.

In another learning mode, trained models can be retrieved from an on-line database 506 for use in detecting target sounds. The previously learned models can be transmitted on a scheduled basis to the earpiece, or as needed, depending on the environmental context. For example, upon the earpiece 100 detecting traffic noise, sound signature models associated with target sounds (e.g., ambulance, police car) in traffic can be retrieved. In another exemplary embodiment, upon the earpiece 100 detecting conversational noise (e.g. people talking), sound signature models for verbal warnings ("help", "police") can be retrieved. Groups of sound signature models can be retrieved based on the environmental context or on user directed action.

As shown in step 508, the earpiece can also generate speech recognition models for target sounds corresponding to voice, such as "help", "police", "fire", etc. The speech recognition models can be retrieved from the on-line database 506 or the user defined database 504. In the latter for example, the user can say a word or enter a text version of a word to associate with a verbal warning sound. For instance, the user can define a set of words of interest along with mappings to their meanings, and then use keyword spotting to detect their occurrences. If the user enters an environment wherein another individual says the same word (e.g., "help") the earpiece 100 can inform the user of the verbal warning sound. For other acoustic sounds, the earpiece 100 can generate sound signature models as shown in step 510. Notably, the earpiece 100 itself can generate the sound signature models, or transmit the captured target sounds to external systems (e.g., remote server) that generate the sound signature models. Such learning can be conducted off-line in a training phase, and the earpiece 100 can be uploaded with the new learning models.

It should also be noted that the learning models can be updated during use of the earpiece, for example, when the earpiece 100 detects target sounds. The detected target sounds can be used to adapt the learning models as new target sound variants are encountered. For example, the earpiece 100 upon detecting a target sound, can use the sound signature of the target sound to update the learned models in accordance with the training phase. In such an exemplary embodiment a first learned model is adapted based on new training data collected in the environment by the earpiece. In such regard, for example, a new set of "horn" target sounds could be included in real-time training without discarding the other "horn" sounds already captured in the existing model.

Upon completion of learning, uploading, or retrieval of sound signature models, the earpiece 100 can monitor and report target sounds within the environment. As shown in step 520, ambient sounds (e.g. input signal) within the environment are captured by the ASM 110. The ambient sounds can be digitized by way of the ADC 202 and stored temporarily to a data buffer in memory 208 as shown in step 522. The data buffer holds enough data to allow for generation of a sound signature as will be described ahead in FIG. 7.

In another configuration, the processor 206 can implement a "look ahead" analysis system by way of the data buffer for reproduction of pre-recorded audio content, using a data buffer to offset the reproduction of the audio signal. The look-ahead system allows the processor to analyze potentially harmful audio artifacts (e.g. high level onsets, bursts, etc.) either received from an external media device, or detected with the ambient microphones, in-situ before it is reproduced. The processor 206 can thus mitigate the audio artifacts in advance to reduce timbral distortion effects caused by, for instance, attenuating high level transients.

At step 524, signal conditioning techniques can be applied to the ambient sound for example to suppress noise or gate the noise to a predetermined threshold. Other signal processing steps such as threshold detection shown in step 526 can be employed to determine whether ambient sounds should be evaluated for target sounds. For instance, to conserve computational processing resources (e.g., battery, processor) only ambient sounds that exceed a predetermined power level are evaluated for target sounds. Other metrics such as signal spectrum, duration, and stationarity are considered in determining whether the ambient sound is analyzed for target sounds. Notably, other metrics (e.g., context aware) can also be employed to determine when the ambient sound should be processed for target sound detection.

If at least one property (e.g., power, spectral shape, duration, etc) of the ambient sound exceeds a threshold (or adaptive threshold), the earpiece 100 at step 530 can proceed to generate a sound signature for the ambient sound. In one exemplary embodiment the sound signature is a feature vector which can include statistical parameters or salient features of the ambient sound. An ambient sound with a target sound (e.g. "bell", "siren"), such as shown in step 532, is generally expected to exhibit features similar to sound signatures for similar target sounds (e.g. "bell", "siren") stored in the user defined database 504 or the on-line database 506. The earpiece 100 can also identify a direction and speed of the sound source if it is moving, for example, by evaluating Doppler shift as shown in step 534 and 536. The earpiece 100, by way of beam-forming among multiple ASM microphones can also estimate a direction of a sound source generating the target sound. In another arrangement, when dual earpieces 100 are used, or when multiple ASMs are employed, the distance and bearing of a sound source can be calculated by frequency dependent magnitude and phase between ASMs 110 (e.g. left and right). The speed and bearing of the sound source can also be estimated using pitch analysis to detect changes predicted by Doppler effect, or alternatively by an analysis in changes in relative phase and magnitude between the two ASM signals. The earpiece 100, by way of a sound recognition engine, can detect general target signals such as car horns or emergency sirens (and other signals referenced by ISO 7731) using spectral and temporal analysis.

The earpiece 100 can also analyze the ambient sound to determine if a verbal target (e.g. "help", "police", "excuse me") is present. As shown in step 540, the sound signature of the ambient sound can be analyzed for speech content. For instance, the sound signature can be analyzed for voice information, such as vocal cord pitch periodicities, time-varying voice formant envelopes, or other articulation parameter attributes. Upon detecting the presence of voice in the ambient sound, the earpiece 100 can perform key word detection (e.g. "help") in the spoken content as shown in step 542. Speech recognition models as well as language models can be employed to identify key words in the spoken content. As previously noted, the user can themselves say or enter in one or more target sounds that can be mapped to associated learning models for sound signature detection.

As shown in step 552, the user can also provide user input to direct operation of the earpiece, for example, to select an operational mode as shown in 550. As one example, the operation mode can enable, disable or adjust monitoring of target sounds. For instance, in listening mode, the earpiece 100 can mix audio content with ambient sound while monitoring for target sounds. In quiet mode, the earpiece 100 can suppress all noises except detected target sounds. The user input may be in the form of a physical interaction (e.g., button press) or a vocalization (e.g., spoken command). The operating mode can also be controlled by a prioritizing module as shown in step 554. The prioritizing module prioritizes target sounds based on severity and context. For example, if the user is in a phone call, and a target sound is detected, the earpiece 100 can audibly inform the user of the warning and/or present a text message of the target sound. If the user is listening to music, and a target sound is detected, the earpiece 100 can automatically shut off the music and alert the user. The user, by way of a user interface or administrator, can rank target sounds and instruct the earpiece 100 how to respond to targets in various contexts.

Figure 6:
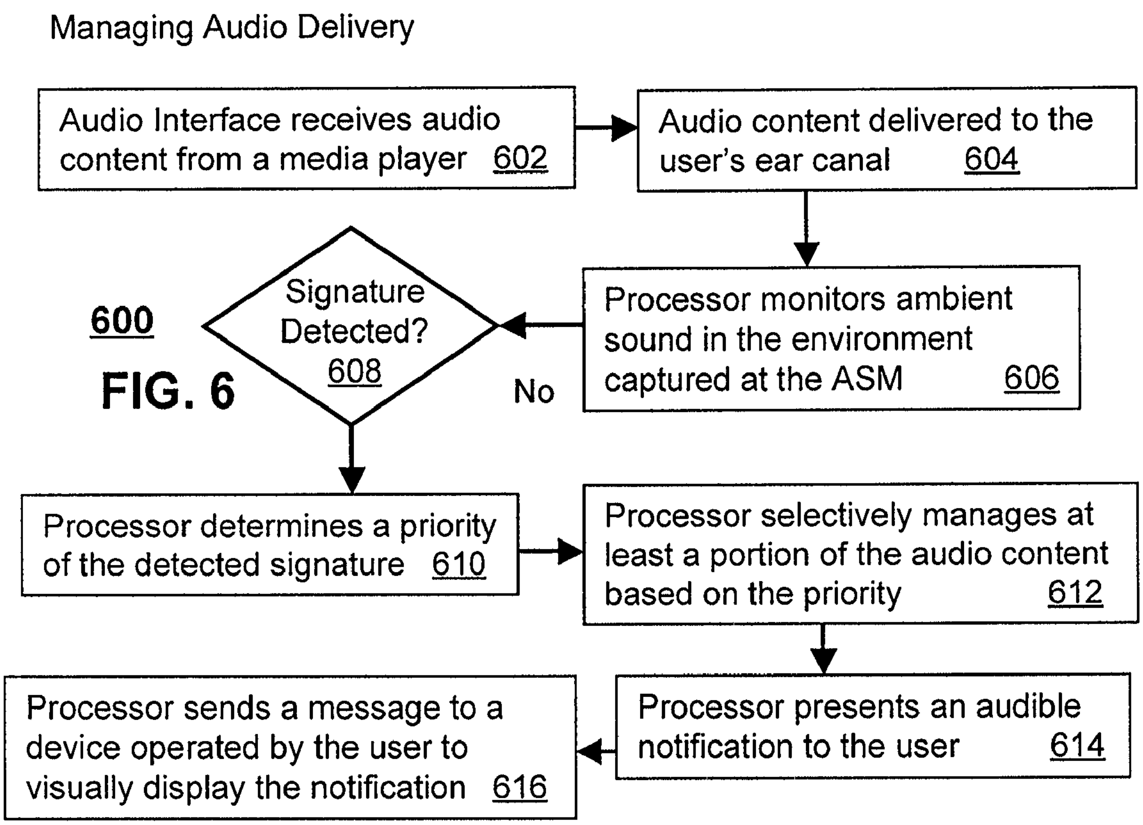
FIG. 6 is a flowchart of a method for managing audio delivery based on detected sound signatures in accordance with an exemplary embodiment.

FIG. 6 is a flowchart of a method 600 for managing audio delivery based on detected sound signatures in accordance with an exemplary embodiment. The method 600 can be practiced with more or less than the number of steps shown and is not limited to the order shown. To describe the method 600, reference will be made to components of FIG. 2, although it is understood that the method 600 can be implemented in any other manner using other suitable components. The method 600 can be implemented in a single earpiece, a pair of earpieces, headphones, or other suitable headset audio delivery device.

As noted previously, the audio interface 212 can supply audio content (e.g., music, cell phone, voice mail, etc) to the earpiece 100. In such regard, the user can listen to music, talk on the phone, receive voice mail, or perform other audio related tasks while the earpiece 100 additionally monitors target sounds in the environment. During normal use, when a target sound is not present, the earpiece 100 can operate normally to recreate the sound experience requested by the user. If however the earpiece 100 detects a target sound, the earpiece 100 can manage audio content delivery to notify the user of the target sound. Managing audio content delivery can include adjusting or overriding other current audio settings.

By way of example, as shown in step 602, the audio interface 212 receives audio content from a media player, such as a portable music player, or cell phone. The audio content can be delivered to the user's ear canal by way of the ECR 120 as shown in step 604. The processor 206 can regulate the delivery of audio to the ear canal such that the sound pressure level dose is within safe limits. For instance, the processor 206 can adjust the audio level in accordance with a personalized hearing level (PHL) previously established for the user. The PHL provides upper and lower volume bounds across frequency for establishing comfortable listening levels.

At step 606, the processor 206 monitors ambient sound in the environment captured at the ASM 110. Ambient sound can be sampled at sufficiently data rates (e.g. 8, 16, and 32 KHz) to allow for feature extraction of sound signatures. Moreover, the processor 206 can adjust the sampling rate based on the information content of the ambient signal. For example, upon the ambient sound exceeding a first threshold, the sampling rate can be set to a first rate (e.g. 4 KHz). As the ambient sound increases in volume, or as prominent features are identified, the sampling rate can be increased to a second rate (e.g. 8 KHz) to increase signal resolution. Although, the higher sampling rate improves resolution of features, the lower sampling rate can preserve use of computational resources for minimally sufficient feature resolution (e.g., battery, processor).

If at step 608, a sound signature is detected, the processor 206 can then determine a priority of the detected sound signature (at step 610). The priority establishes how the earpiece 100 manages audio content. Notably, target sounds for various environmental conditions and user experiences can be learned. Accordingly, the user or an administrator, can establish priorities for target sounds. Moreover, these priorities can be based on environmental context. For example, if a user is in a warehouse where loading vehicles emit a beeping sound, sound signatures for such vehicles can be given the highest priority. A user can also prioritize learned target sounds for example via a user interface on a paired device (e.g., cell phone), or via speech recognition (e.g., "prioritize—'ambulance'—high").

Upon detecting a target sound and identifying a priority, the processor 206 at step 612 selectively manages at least a portion of the audio content based on the priority. For example, if the user is listening to music during the time a target sound is detected, the processor 206 can decrease the music volume to present an audible notification. This is one indication that the earpiece 100 has detected a target sound. At step 614, the processor can further present an audible notification to the user. For instance, upon detecting a "horn" sound, a speech-to-text message can be presented to the user to audibly inform them that a horn sound has been detected (e.g., "horn detected"). Information related to the target sound (e.g., direction, speed, priority, etc.) can also be presented with the audible notification.

In a further arrangement, the processor 206 can send a message to a device operated by the user to visually display the notification as shown in step 616. For example, if the user has disengaged audible notification, the earpiece 100 can transmit a text message to a paired device (e.g. cell phone) containing the audible warning. Moreover, the earpiece 100 can beacon out an audible alarm to other devices within a vicinity, for example via Wi-Fi (e.g., IEEE 802.16x). Other devices in the proximity of the user can sign up to receive audible alarms from the earpiece 100. In such regard, the earpiece 100 can beacon a warning notification to other devices in the area to share warning information with other users.

Figure 7:
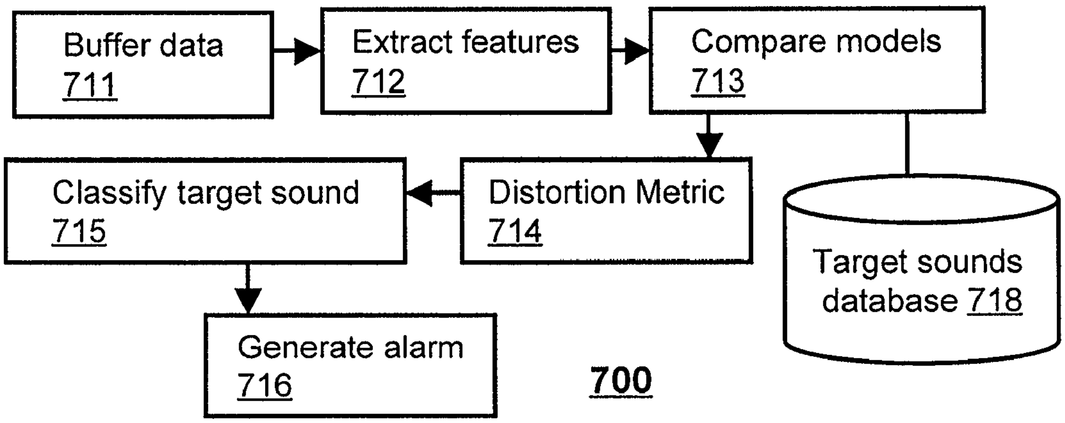
FIG. 7 is a flowchart for sound signature detection in accordance with an exemplary embodiment.

FIG. 7 is a flowchart of a method 700 further describing sound signature detection in accordance with an exemplary embodiment. The method 700 can be practiced with more or less than the number of steps shown and is not limited to the order shown. The method 700 can begin in a state in which the earpiece 100 is actively monitoring target sounds in the environment.

At step 711, ambient sound captured from the ASM 110 can be buffered into short term memory as frames. As an example, the ambient sound can be sampled at 8 KHz with 10-20 ms frame sizes (80 to 160 samples). The frame size can also vary depending on the energy level of the ambient sound. For example, the processor 206 upon detecting low level sounds (e.g., 70-74 dB SPL) can use a frame size of 30 ms, and update the frame size to 10 ms as the power level increases (e.g. >86 dB SPL). The processor 206 can also increase the sampling rate in accordance with the power level and/or a duration of the ambient sound. (A longer frame size with lower sampling can compromise resolution for computational resources.) The data buffer is of sufficient length to hold a history of frames (e.g. 10-15 frames) for short-term historical analysis.

At step 712, the processor 206 can perform feature extraction on the frame as the ambient sound is buffered into the data buffer. As one example, feature extraction can include performing a filter-bank analysis and summing frequencies in auditory bandwidths. Features can also include Fast Fourier Transform (FFT) coefficients, Discrete Cosine Transform (DCT) coefficients, cepstral coefficients, PARCOR coefficients, wavelet coefficients, statistical values (e.g., energy, mean, skew, variance), parametric features, or any other suitable data compression feature set. Additionally, dynamic features, such as derivatives of any order, can be added to the static feature set. As one example, mel-frequency-cepstral analysis can be performed on the frame to generate between 10-16 mel-frequency-cepstral coefficients. The small number of coefficients represent features that can be compactly stored to memory for that particular frame. Such front end feature extraction techniques reduce the amount of data needed to represent the data frame.

At step 713, the features can be incorporated as a sound signature and compared to learned models, for example, those retrieved from the target sounds database 718 (e.g., user defined database 504 or the on-line database 506 of FIG. 5). A sound signature can be defined as a sound in the user's ambient environment which has significant perceptual saliency. As an example, a sound signature can correspond to an alarm, an ambulance, a siren, a horn, a police car, a bus, a bell, a gunshot, a window breaking, or any other target sound, including voice. The sound signature can include features characteristic to the sound. As an example, the sound signature can be classified by statistical features of the sound (e.g., envelope, harmonics, spectral peaks, modulation, etc.).

Notably, each learned model used to identify a sound signature has a set of features specific to a target sound. For example, a feature vector of a learned model for an "alarm" is sufficiently different from a feature vector of a learned model for a "bell sound". Moreover, the learned model can describe interconnectivity (e.g., state transitions, emission probabilities, initial probabilities, synaptic connections, hidden layers) among the feature vectors (e.g. frames). For instance, the features of a "bell" sound may change in a specific manner compared to the features of an "alarm" sound. The learned model can be a statistical model such as a Gaussian mixture model, a Hidden Markov Model (HMM), a Bayes Classifier, or a Neural Network (NN) that requires training.

In the foregoing, a Gaussian Mixture Model (GMM) is presented, although it should be noted that any of the above models can be used for sound signature detection. In this case, each target sound can have an associated GMM used for detecting the target sound. As an example, the target sound for an "alarm" will have its own GMM, and a target sound for a "bell" will have its own GMM. Separate GMMs can also be used as a basis for the absence of the sounds ("anti-models"), such as "not alarm" or "not bell." Each GMM provides a model for the distribution of the feature statistics for each target sound in a multi-dimensional space. Upon presentation of a new feature vector, the likelihood of the presence of each target sound can then be calculated. In order to detect a target sound, each target sound's GMM is evaluated relative to its anti-model, and a score related to the likelihood of that target sound is computed. A threshold can be applied directly to this score to decide whether the target sound is present or absent. Similarly, the sequence of scores can be relayed to yet another module which uses a more complex rule to decide presence or absence. Examples of such rules include linear smoothing or median filtering.

As previously noted, a HMM model or NN model with their associated connection logic can be used in place of each GMM for each learning model. For instance, each target sound in the database (718 see FIG. 7) can have a corresponding HMM. A sound signature for a target sound captured at the ASM 110 in ambient sound can be processed through a lattice network (e.g. Viterbi network) for comparison to each HMM to determine which HMM corresponds to the target sound, if any. Alternatively, in a trained NN, the sound signature can be input to the NN wherein the output states of the NN correspond to target sound indices. The NN can include various topologies such as a Feed-Forward, Radial Basis Function, Hopfield, Time-Delay Recurrent, or other optimized topologies for real-time sound signature detection.

At step 714, a distortion metric is performed with each learned model to determine which learned models are closest to the captured feature vector (e.g., sound signature). The learned model with the smallest distortion (e.g., mathematical distance) is generally considered the correct match, or recognition result. It should also be noted that the distortion can be calculated as part of the model comparison in step 713. This is because the distortion metric may depend on the type of model used (e.g., HMM, NN, GMM, etc) and in fact may be internal to the model (e.g. Viterbi decoding, back-propagation error update, etc). The distortion module is merely presented in FIG. 7 as a separate component to suggest use with other types of pattern recognition methods or learning models.

Upon evaluating the feature vector (e.g. sound signature) against the candidate target sound learned models, the ambient sound at step 715 can be classified as a target sound. Each of the learned models can be associated with a score. For example, upon the presentation of a sound signature, each GMM will produce a score. The scores can be evaluated against a threshold, and the GMM with the highest score can be identified as the detected target sound. For instance, if the learned model for the "alarm" sound produces the highest score (e.g., smallest distortion result) compared to other learned models, the ambient sound is classified as an "alarm" target sound.

The classification step 715 also takes into account likelihoods (e.g. recognition probabilities). For instance, as part of the step of comparing the sound signature of the unknown ambient sound against all the GMMs for the learned models, each GMM can produce a likelihood result, or output. As an example, these likelihood results can be evaluated against each other or in the context in a logical context to determine the GMM considered "most likely" to match the sound signature of the target sound. The processor 206 can then select the GMM with the highest likelihood or score via soft decisions.

The earpiece 100 can continually monitor the environment for target sounds, or monitor the environment on a scheduled basis. In one arrangement, the earpiece 100 can increase monitoring in the presence of high ambient noise possibly signifying environmental danger or activity. Upon classifying an ambient sound as a target sound the processor 206 at step 716 can generate an alarm. As previously noted, the earpiece 100 can mix the target sound with audio content, amplify the target sound, reproduce the target sound, and/or deliver an audible message. As one example, spectral bands of the audio content that mask the target sound can be suppressed to increase an audibility of the target sound. This serves to notify the user of a target sounded detected in the environment, to which the user may not be aware depending on their environmental context.

As an example, the processor 206 can present an amplified audible notification to the user via the ECR 120. The audible notification can be a synthetic voice identifying the target sound (e.g. "car alarm"), a location or direction of the sound source generating the target sound (e.g. "to your left"), a duration of the target sound (e.g., "3 minutes") from initial capture, and any other information (e.g., proximity, severity level, etc.) related to the target sound. Moreover, the processor 206 can selectively mix the target sound with the audio content based on a predetermined threshold level. For example, the user can prioritize target sound types for receiving various levels of notification, and/or identify the sound types as desirable of undesirable.

Figure 8:
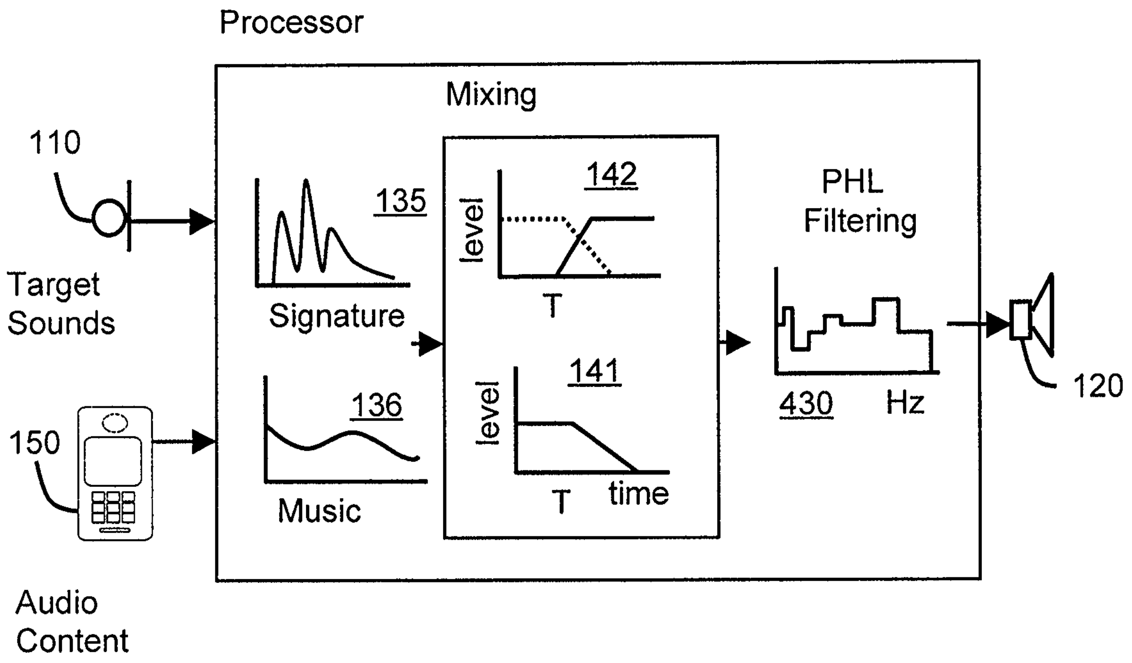
FIG. 8 is a pictorial diagram for mixing ambient sounds and target sounds with audio content in accordance with an exemplary embodiment.

FIG. 8, presents a pictorial diagram 800 for mixing ambient sounds and target sounds with audio content. In the illustration show, the earpiece 100 is playing music 136 to the ear canal via ECR 120 while simultaneously monitoring target sounds in the environment. At time, T, the processor 206 upon detecting a target sound (signature 135) can lower the music volume from the media player 150 (graph 141), and increase the volume of the ambient sound received at the ASM 110 (graph 142). Other mixing arrangements are herein contemplated. In such regard, the user hears a smooth audio transition between the music and the target sound. Notably, the ramp up and down times can also be adjusted based on the priority of the target sound. For example, in an extreme case, the processor 206 can immediately shut off the music, and present the audible warning. Other various implementations for mixing audio and managing audio content delivery have been herein contemplated. Moreover, the audio content can be managed with other media devices (e.g., cell phone). For instance, upon detecting a target sound, the processor 206 can inform the user and the called party of a target sound. In such regard, the user does not need to inform the called party since they also receive the notification which can save them time to explain an emergency situation.

As one example, the processor 206 can spectrally enhance the audio content in view of the ambient sound. Moreover, a timbral balance of the audio content can be maintained by taking into account level dependent equal loudness curves and other psychoacoustic criteria (e.g., masking) associated with the personalized hearing level (PHL). For instance, auditory queues in a received audio content can be enhanced based on the PHL 430 and a spectrum of the ambient sound captured at the ASM 110. Frequency peaks within the audio content can be elevated relative to ambient noise frequency levels and in accordance with the PHL to permit sufficient audibility of the ambient sound. The PHL reveals frequency dynamic ranges that can be used to limit the compression range of the peak elevation in view of the ambient noise spectrum.

In one arrangement, the processor 206 can compensate for a masking of the ambient sound by the audio content. Notably, the audio content if sufficiently loud, can mask auditory queues in the ambient sound, which can i) potentially cause hearing damage, and ii) prevent the user from hearing target sounds in the environment (e.g., an approaching ambulance, an alarm, etc.) Accordingly, the processor 206 can accentuate and attenuate frequencies of the audio content and ambient sound to permit maximal sound reproduction while simultaneously permitting audibility of ambient sounds. In one arrangement, the processor 206 can narrow noise frequency bands within the ambient sound to permit sensitivity to audio content between the frequency bands. The processor 206 can also determine if the ambient sound contains salient information (e.g., target sounds) that should be un-masked with respect to the audio content. If the ambient sound is not relevant, the processor 206 can mask the ambient sound (e.g., increase levels) with the audio content until target sounds are detected.

Note that in at least one exemplary embodiment the ASM is not part of an earpiece and is configured to measure the environment. Additionally in at least one exemplary embodiment the ECR is not part of an earpiece but can be a speaker that emits a notification signal. Note that at least one exemplary embodiment is an acoustic device (e.g., non-earpiece) that includes the ASM, optionally an ECR, and optionally ECM.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions of the relevant exemplary embodiments. Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. An acoustic device, comprising:

an Ambient Sound Microphone (ASM) configured to capture ambient sound;

at least one Ear Canal Receiver (ECR) configured to deliver audio to an ear canal; and a processor operatively coupled to the ASM and the ECR, where the processor monitors the ambient sound for a target sound and adjusts the audio delivered to the ear canal based on the target sound, the processor generating a sound signature from the ambient sound and comparing the sound signature to a plurality of learned signature models to detect the target sound.

2. The acoustic device of claim 1, where the acoustic device is an earpiece, wherein the target sound is at least one among an alarm, a horn, and a noise.

3. The acoustic device of claim 1, where the acoustic device is an earpiece, wherein the processor monitors the ambient sound for spoken words associated with verbal warnings.

4. The acoustic device of claim 1, where the acoustic device is an earpiece, further comprising a memory to store, responsive to a directive by a user of the acoustic device, at least one target sound captured by the ASM for learning.

5. The acoustic device of claim 1, where the acoustic device is an earpiece, further comprising an audio interface operatively coupled to the processor configured to receive audio content from a media player or cell phone, wherein the processor selectively adjusts a volume of the audio content delivered to the ear canal when the target sound is detected.

6. A method for personalized listening, the method comprising:

capturing ambient sound with an Ambient Sound Microphone (ASM);

monitoring the ambient sound for a target sound by generating a sound signature from the ambient sound and comparing the sound signature to a plurality of learned signature models to detect the target sound; and adjusting a delivery of audio by an Ear Canal Receiver (ECR) in an earpiece to an ear canal based on the target sound.

7. The method of claim 6, further comprising: passing the target sound to the ECR for delivery to the ear canal.

8. The method of claim 6, further comprising: amplifying the target sound for delivery to the ear canal.

9. The method of claim 6, further comprising: attenuating the target sound for delivery to the ear canal.

10. The method of claim 6, further comprising: generating an audible message for delivery to the ear canal.

11. The method of claim 6, further comprising:

mixing the target sound with audio content delivered to the earpiece in accordance with a priority of the target sound.

12. The method of claim 6, further comprising: detecting and reporting from the sound signature a direction or a speed of a sound source generating the target sound.

13. The method of claim 6, further comprising: detecting and reporting from the sound signature a spoken utterance in the ambient sound associated with verbal warnings.

14. The method of claim 6, further comprising: identifying the target sound from the sound signature and transmitting a warning notification to other devices.

15. The method of claim 6, wherein the target sound is at least one among an alarm, a horn, a voice, and a noise.

16. A method for sound signature detection, the method comprising:

capturing ambient sound with an Ambient Sound Microphone (ASM); and receiving a directive to learn a sound signature within the ambient sound, where a voice command or an indication from a user is received and is used to initiate the steps of capturing and learning.

17. The method of claim 16, further comprising: saving the sound signature locally on an earpiece or remotely to a server.

18. A method for personalized listening, the method comprising:

capturing ambient sound via an earpiece that is at least partially occluded in an ear canal;

detecting a sound signature within the ambient sound that is associated with a target sound; and mixing the target sound with audio content delivered to the earpiece in accordance with a priority of the target sound and a personalized hearing level (PHL), where learned models are retrieved from a database, the sound signature is compared to the learned models, and the target sound is identified from the learned models in view of the comparison.

19. The method of claim 18, further comprising: enhancing auditory queues in the target sound relative to the audio content based on a spectrum of the ambient sound captured at an ambient sounds microphone (ASM).

20. A sound detection device comprising:

an ambient sound microphone configured to measure an ambient sound;

an ear canal microphone; and a processor configured to compare the ambient sound to at least one target sound signature, and where the processor identifies an onset of an identified target sound signature in the ambient sound, where the ear canal microphone is configured to emit an auditory warning when the processor identifies the onset.

21. The sound detection device according to claim 20, where the ear canal microphone is operatively connected to an earpiece.

* * * * *